(12) United States Patent
Zhou et al.

(10) Patent No.: US 10,734,947 B2
(45) Date of Patent: Aug. 4, 2020

(54) SYSTEMS AND METHODS FOR FREQUENCY COMPENSATION OF REAL-TIME-CLOCK SYSTEMS

(71) Applicant: GUANGZHOU ON-BRIGHT ELECTRONICS CO., LTD., Guangzhou (CN)

(72) Inventors: Rusheng Zhou, Guangzhou (CN); Jiapeng Zhang, Guangzhou (CN)

(73) Assignee: Guangzhou On-Bright Electronics Co., Ltd., Guangzhou (CN)

( * ) Notice: Subject to any disclaimer, the term of this patent is extended or adjusted under 35 U.S.C. 154(b) by 57 days.

(21) Appl. No.: 15/665,191

(22) Filed: Jul. 31, 2017

(65) Prior Publication Data

US 2019/0013778 A1 Jan. 10, 2019
US 2020/0204113 A9 Jun. 25, 2020

(30) Foreign Application Priority Data

Jul. 5, 2017 (CN) .......................... 2017 1 0542448

(51) Int. Cl.
 *H03B 5/04* (2006.01)
 *H03B 5/32* (2006.01)
 (Continued)

(52) U.S. Cl.
 CPC ............. *H03B 5/04* (2013.01); *H03B 5/32* (2013.01); *H03L 1/026* (2013.01); *H03L 1/028* (2013.01); *G01R 31/2824* (2013.01)

(58) Field of Classification Search
 CPC ........... H03L 1/026; H03L 1/028; G04G 3/04; G01R 31/2824; H03B 5/04; H03B 5/32
 See application file for complete search history.

(56) References Cited

U.S. PATENT DOCUMENTS

| 4,921,467 A | 5/1990 | Lax |
| 5,740,525 A | 4/1998 | Spears |

(Continued)

FOREIGN PATENT DOCUMENTS

| CN | 1671047 A | 9/2005 |
| CN | 1705222 A | 12/2005 |

(Continued)

OTHER PUBLICATIONS

Taiwan Intellectual Property Office, Office Action dated Sep. 28, 2018, in Application No. 106136997.

(Continued)

*Primary Examiner* — Ryan Johnson
(74) *Attorney, Agent, or Firm* — Faegre Drinker Biddle & Reath LLP

(57) ABSTRACT

Method and system for temperature-dependent frequency compensation. For example, the method for temperature-dependent frequency compensation includes determining a first frequency compensation as a first function of temperature using one or more crystal oscillators, processing information associated with the first frequency compensation as the first function of temperature, and determining a second frequency compensation for a crystal oscillator as a second function of temperature based on at least information associated with the first frequency compensation as the first function of temperature. The one or more crystal oscillators do not include the crystal oscillator, and the first frequency compensation as the first function of temperature is different from the second frequency compensation as the second function of temperature.

17 Claims, 8 Drawing Sheets

(51) Int. Cl.
*H03L 1/02* (2006.01)
*G01R 31/28* (2006.01)

(56) References Cited

U.S. PATENT DOCUMENTS

| | | |
|---|---|---|
| 5,781,073 A | 7/1998 | Mii |
| 5,892,408 A | 4/1999 | Binder |
| 6,041,222 A | 3/2000 | Horton et al. |
| 6,584,380 B1 | 6/2003 | Nemoto |
| 6,636,121 B2 | 10/2003 | Barak et al. |
| 6,661,302 B1 | 12/2003 | Rathore et al. |
| 7,010,307 B2 * | 3/2006 | Abraham .............. G01S 19/235 331/158 |
| 7,154,351 B2 | 12/2006 | Kawasaki et al. |
| 7,371,005 B1 | 5/2008 | Ahuja et al. |
| 7,449,968 B1 | 11/2008 | Cioffi et al. |
| 7,791,418 B2 * | 9/2010 | Gros ....................... G04G 3/02 331/156 |
| 2002/0177267 A1 | 11/2002 | Beer et al. |
| 2009/0002086 A1 | 1/2009 | Lakdawala et al. |
| 2009/0195322 A1 * | 8/2009 | Yan ..................... H03L 1/022 331/44 |

FOREIGN PATENT DOCUMENTS

| | | |
|---|---|---|
| CN | 1968006 A | 5/2007 |
| CN | 101965568 A | 2/2011 |
| CN | 202059371 U | 11/2011 |
| CN | 102868363 A | 1/2013 |
| CN | 104052403 A | 9/2014 |
| CN | 104716904 A | 6/2015 |
| CN | 102981551 B | 7/2015 |
| CN | 105850035 A | 8/2016 |
| TW | 201448473 A | 12/2014 |

OTHER PUBLICATIONS

China Patent Office, Office Action dated Apr. 1, 2020 in Application No. 201710542448.X.

* cited by examiner

SYSTEMS AND METHODS FOR FREQUENCY COMPENSATION OF REAL-TIME-CLOCK SYSTEMS

1. CROSS-REFERENCES TO RELATED APPLICATIONS

This application claims priority to Chinese Patent Application No. 201710542448.X, filed Jul. 5, 2017, incorporated by reference herein for all purposes.

2. BACKGROUND OF THE INVENTION

Certain embodiments of the present invention are directed to real-time clocks. More particularly, some embodiments of the invention provide systems and methods for frequency compensation of real-time clocks. Merely by way of example, some embodiments of the invention have been applied to temperature-dependent frequency compensation. But it would be recognized that the invention has a much broader range of applicability.

Real-time clocks (RTCs) often are used in electronics products to provide clocking or time-setting. These electronic products include mobile phones, digital cameras, computers, alarm clocks, electricity meters, watches, and/or smart home appliances. For real-time clocks, crystal oscillators often serve as driving sources, and frequency precision of the crystal oscillators usually determine precision of the real-time clocks. Conventional crystal oscillators often have a frequency precision error in the range of ±20 ppm at the room temperature and in the range wider than ±100 ppm at a higher temperature (e.g., at 70° C.) or at a lower temperature (e.g., at −30° C.). Specifically, ±20 ppm represents an error range of ±2 seconds per day, and ±100 ppm represents an error range of ±10 seconds per day. Such precision error ranges may not be acceptable under certain circumstances.

Frequency changes of crystal oscillators with temperature often can be curve-fitted, and the corresponding fitting coefficients can be obtained (e.g., through multiple iterations). For example, the desired frequency minus the actual frequency is represented by the frequency compensation. In another example, for a crystal oscillator, its frequency compensation as a function of temperature is as follows:

$$\Delta f = aT^3 + bT^2 + cT + d \qquad \text{(Equation 1)}$$

where $\Delta f$ represents the frequency compensation for the crystal oscillator, which is the desired frequency minus the actual frequency. Additionally, T represents the temperature of the crystal oscillator, and a, b, c and d represent coefficients.

Usually, the coefficients a, b, c and d are predetermined by measuring actual frequencies of the crystal oscillator at four different temperatures, and calculating the corresponding frequency compensation values at these four temperatures. For example, at each of these four temperatures, a real-time-clock system that contains the crystal oscillator is placed at that particular temperature (e.g., as measured by a temperature sensor) for a period of time in order to achieve thermal equilibrium of the system. Such period of time needed for each measurement often renders the calibration process inefficient. Each crystal oscillator needs to be measured at four different temperatures to determine its coefficients a, b, c and d as shown in Equation 1, and these four measurements need to be repeated for different crystal oscillators that may have different coefficient values.

In contrast, temperature-compensated crystal oscillators (TCXOs) usually have smaller frequency precision errors, but they often are much more expensive. The temperature-compensated crystal oscillators often are not feasible for low-cost designs.

Hence it is highly desirable to improve the techniques of temperature compensation for real-time-clock (RTC) systems.

3. BRIEF SUMMARY OF THE INVENTION

Certain embodiments of the present invention are directed to real-time clocks. More particularly, some embodiments of the invention provide systems and methods for frequency compensation of real-time clocks. Merely by way of example, some embodiments of the invention have been applied to temperature-dependent frequency compensation. But it would be recognized that the invention has a much broader range of applicability.

According to one embodiment, a method for temperature-dependent frequency compensation includes determining a first frequency compensation as a first function of temperature using one or more crystal oscillators, processing information associated with the first frequency compensation as the first function of temperature, and determining a second frequency compensation for a crystal oscillator as a second function of temperature based on at least information associated with the first frequency compensation as the first function of temperature. The one or more crystal oscillators do not include the crystal oscillator, and the first frequency compensation as the first function of temperature is different from the second frequency compensation as the second function of temperature.

According to another embodiment, a method for temperature-dependent frequency compensation includes determining a first frequency compensation as a first function of temperature using one or more crystal oscillators, processing information associated with the first frequency compensation as the first function of temperature, and determining a second frequency compensation for a crystal oscillator as a second function of temperature based on at least information associated with the first frequency compensation as the first function of temperature. The first function of temperature is configured to provide multiple first compensation values for the first frequency compensation in response to multiple first temperatures respectively, and the second function of temperature is configured to provide multiple second compensation values for the second frequency compensation in response to multiple second temperatures respectively.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to real-time clocks. More particularly, some embodiments of the invention provide systems and methods for frequency compensation of real-time clocks. Merely by way of example, some embodiments of the invention have been applied to temperature-dependent frequency compensation. But it would be recognized that the invention has a much broader range of applicability.

Figure 1:
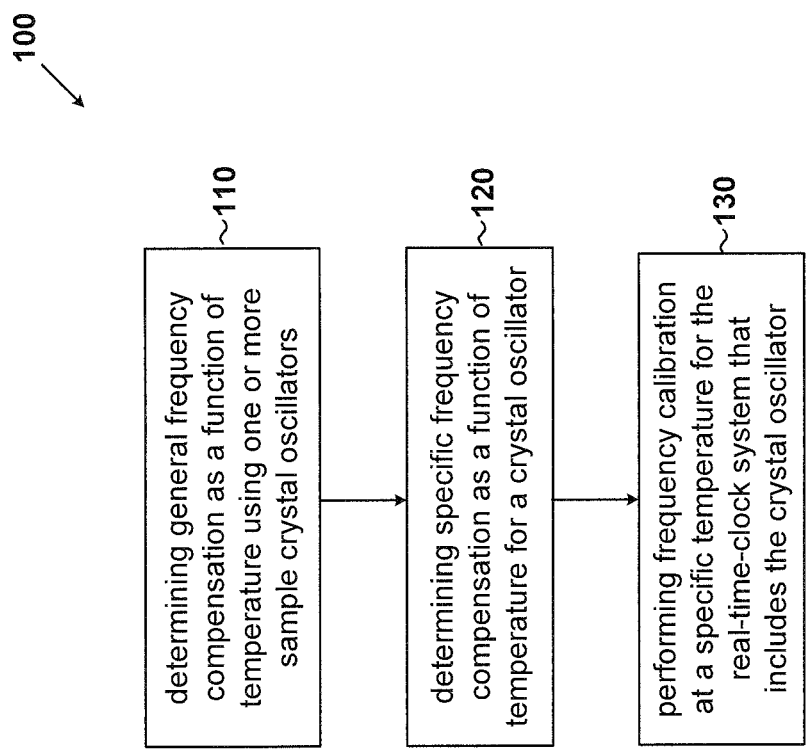
FIG. 1 is a simplified diagram showing a method for temperature-dependent frequency compensation for one or more real-time-clock systems according to an embodiment of the present invention.

FIG. 1 is a simplified diagram showing a method for temperature-dependent frequency compensation for one or more real-time-clock systems according to an embodiment of the present invention. This diagram is merely an example, which should not unduly limit the scope of the claims. One of ordinary skill in the art would recognize many variations, alternatives, and modifications. The method 100 for temperature-dependent frequency compensation includes a process 110 for determining general frequency compensation as a function of temperature using one or more sample crystal oscillators, a process 120 for determining specific frequency compensation as a function of temperature for a crystal oscillator, and a process 130 for performing frequency calibration at a specific temperature for the real-time-clock system that includes the crystal oscillator.

In one embodiment, the process 110 for determining general frequency compensation as a function of temperature is performed for a batch of crystal oscillators, from which the one or more sample crystal oscillators are selected. In another embodiment, the process 120 for determining specific frequency compensation as a function of temperature is repeated for different crystal oscillators in the batch of crystal oscillators. In yet another embodiment, for the crystal oscillator whose specific frequency compensation as a function of temperature has been determined, the process 130 for performing frequency calibration for the real-time-clock system that includes the crystal oscillator is performed at one temperature (e.g., one ambient temperature) or is repeated at multiple temperatures (e.g. multiple ambient temperatures).

Figure 2A:
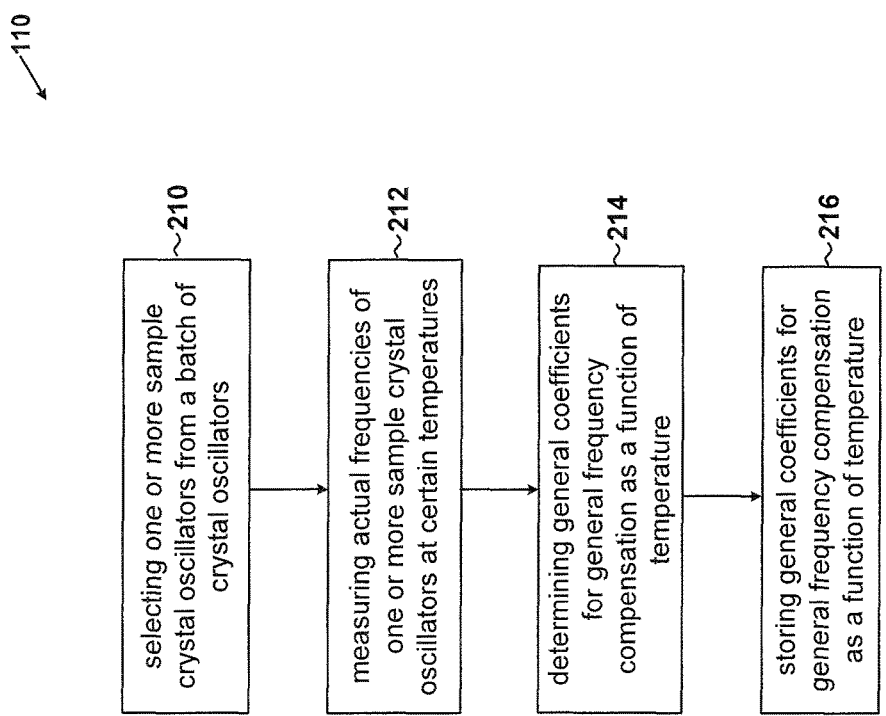
FIG. 2(A) is a simplified diagram showing the process for determining general frequency compensation as a function of temperature using one or more sample crystal oscillators as part of the method for temperature-dependent frequency compensation according to an embodiment of the present invention.

FIG. 2(A) is a simplified diagram showing the process 110 for determining general frequency compensation as a function of temperature using one or more sample crystal oscillators as part of the method 100 for temperature-dependent frequency compensation according to an embodiment of the present invention. This diagram is merely an example, which should not unduly limit the scope of the claims. One of ordinary skill in the art would recognize many variations, alternatives, and modifications. The process 110 for determining general frequency compensation as a function of temperature using one or more sample crystal oscillators includes a process 210 for selecting one or more sample crystal oscillators from a batch of crystal oscillators, a process 212 for measuring actual frequencies of one or more sample crystal oscillators at certain temperatures, a process 214 for determining general coefficients for general frequency compensation as a function of temperature, and a process 216 for storing general coefficients for general frequency compensation as a function of temperature.

At the process 210, one or more sample crystal oscillators are selected from a batch of crystal oscillators according to one embodiment. In one embodiment, a number of sample crystal oscillators are selected (e.g., randomly) from a batch of crystal oscillators (e.g., a same production batch of crystal oscillators). For example, the crystal oscillators in the same production batch have similar relationship between frequency compensation and temperature.

In another embodiment, the number of the one or more sample crystal oscillators is determined based on the total number of crystal oscillators in the batch. For example, the one or more sample crystal oscillators include a plurality of sample crystal oscillators. In another example, the more sample crystal oscillators being selected, the more accurate the general frequency compensation as a function of temperature can be determined. In another example, tens of sample crystal oscillators are selected from the total of hundreds of crystal oscillators in the batch. In yet another example, hundreds of sample crystal oscillators are selected from the total of thousands of crystal oscillators in the batch.

At the process 212, actual frequencies of the one or more sample crystal oscillators are measured at certain temperatures according to one embodiment. In one embodiment, for each of the one or more sample crystal oscillators, actual frequencies are measured at the same set of temperatures. For example, actual frequencies are measured at multiple temperatures for one sample crystal oscillator, and the same measurement process is repeated for each of the remaining sample crystal oscillators at the same set of multiple temperatures.

In another embodiment, the number of the temperature points in the set of temperatures is determined based at least in part on the order of a fitting compensation curve that is used to represent general frequency compensation as a function of temperature. For example, the higher the order of the compensation curve is, the more accurate the general frequency compensation as a function of temperature can be determined. In another example, if the order of the fitting compensation curve is N, the number of the temperature points in the set of temperatures is N+1, where N is an integer larger than 1.

In yet another embodiment, after the number of the temperature points in the set of temperatures is determined, values of these temperature points are also determined. For example, values of the temperatures points are determined based at least in part on the working temperature range of a real-time-clock system in which the crystal oscillator is to be included. In another example, values of the temperature points are distributed approximately evenly in a high-temperature region, a medium-temperature region, and a low-temperature region of the working temperature range of the system. In yet another example, if the working temperature range of the real-time-clock system is from −30° C. to +70° C. and the order of the fitting compensation curve is 3, the number of the temperature points in the set of temperatures is equal to 4 and the values of these temperature points are, for example, equal to −25° C., 5° C., 35° C. and 65° C.

In yet another embodiment, a sample crystal oscillator included in a real-time-clock system is kept at each of the temperature points for a period of time (e.g., 30 minutes) to ensure that the thermal equilibrium is reached. For example, afterwards, the real-time-clock system is set to output a signal with a desired frequency of 1 Hz (e.g., a one-second signal), and the actual frequencies of the real-time clock system are measured at all of the temperature points in the set of temperatures, so that the actual frequencies of the sample crystal oscillator at these temperature points are determined.

At the process 214, general coefficients for general frequency compensation as a function of temperature are determined according to one embodiment. In one embodiment, at each of the temperature points, actual frequencies of all of the one or more sample crystal oscillators are averaged, so that an average frequency at each of the temperature points is determined. For example, using the average frequency, a frequency compensation value at the corresponding temperature point is determined by subtracting the average frequency from the desired frequency (e.g., the ideal frequency). In another example, the desired frequency of a crystal oscillator is 32.768 KHz, but at 5° C., the average frequency is 32.766 KHz, so the compensation value at the temperature of 5° C. is 0.002 KHz.

In another embodiment, after frequency compensation values at all of the temperature points are determined, the general coefficients for general frequency compensation as a function of temperature are determined. For example, the general frequency compensation for crystal oscillator is equal to the desired frequency (e.g., the ideal frequency) minus the actual frequency. In another example, using N+1 frequency compensation values at N+1 temperature points, the general coefficients for the following $N^{th}$-order fitting compensation curve are determined.

$$\Delta f_g = a_N T^N + a_{N-1} T^{N-1} + \ldots + a_n T^n + \ldots + a_1 T + a_0 \quad \text{(Equation 2)}$$

where $\Delta f_g$ represents the general frequency compensation as a function of temperature for crystal oscillator, which is equal to the desired frequency (e.g., the ideal frequency) minus the actual frequency. Additionally, T represents the temperature of the crystal oscillator. Moreover, n is smaller than or equal to N, and larger than or equal to zero, where N is an integer larger than 1. Also, $a_n$ represents N+1 general coefficients, with n ranging from 0 to N.

In yet another example, the fitting compensation curve as shown in Equation 2 is used to represent general frequency compensation as a function of temperature (e.g., for the batch of crystal oscillators from which the one or more sample crystal oscillators have been selected at the process 210). In yet another example, the function (e.g., $\Delta f_g$) of temperature for the general frequency compensation of crystal oscillator is configured to provide multiple compensation values for the general frequency compensation of crystal oscillator in response to multiple temperature values (e.g., T) of the crystal oscillator respectively.

At the process 216, the general coefficients for general frequency compensation as a function of temperature are stored according to one embodiment. For example, the general coefficients $a_N, a_{N-1}, \ldots, a_n, \ldots, a_1$, and $a_0$ as shown in Equation 2 are stored.

Figure 2B:
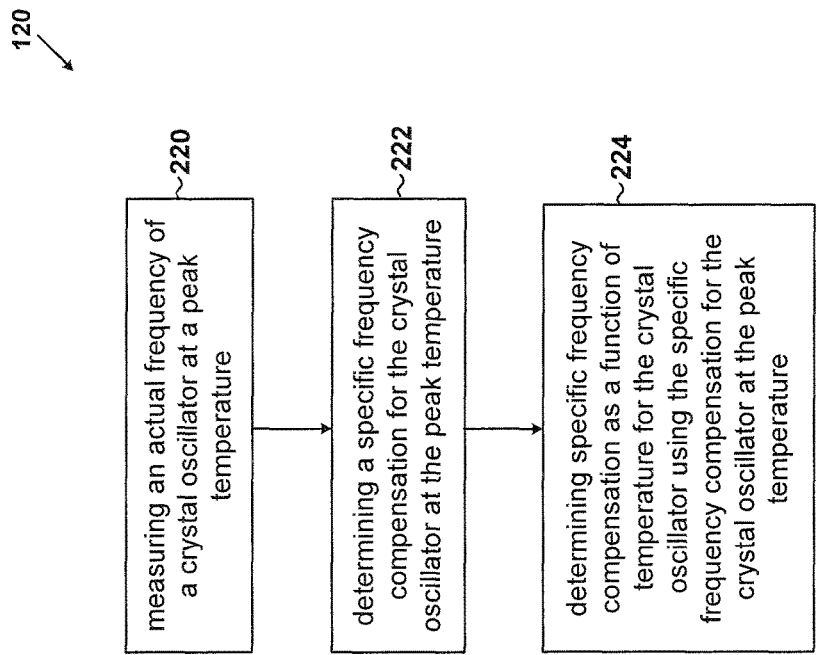
FIG. 2(B) is a simplified diagram showing the process for determining specific frequency compensation as a function of temperature for a crystal oscillator as part of the method for temperature-dependent frequency compensation according to an embodiment of the present invention.

FIG. 2(B) is a simplified diagram showing the process 120 for determining specific frequency compensation as a function of temperature for a crystal oscillator as part of the method 100 for temperature-dependent frequency compensation according to an embodiment of the present invention. This diagram is merely an example, which should not unduly limit the scope of the claims. One of ordinary skill in the art would recognize many variations, alternatives, and modifications. The process 120 for determining specific frequency compensation as a function of temperature for a crystal oscillator includes a process 220 for measuring an actual frequency of a crystal oscillator at a peak temperature, a process 222 for determining a specific frequency compensation for the crystal oscillator at the peak temperature, a process 224 for determining specific frequency compensation as a function of temperature for the crystal oscillator using the specific frequency compensation for the crystal oscillator at the peak temperature.

At the process 220, an actual frequency of a crystal oscillator at a peak temperature is measured according to one embodiment. For example, the peak temperature falls within a range of 25° C.±5° C. for the crystal oscillators in the same batch.

In one embodiment, the peak temperature is the temperature, at which the desired frequency (e.g., the ideal frequency) of the crystal oscillator is the highest in comparison with the desired frequencies (e.g., the ideal frequencies) at other temperatures. For example, at the peak temperature, the actual frequency (e.g., the measured frequency) of the crystal oscillator is also the highest in comparison with the actual frequencies (e.g., the measured frequencies) at other temperatures. In another embodiment, the peak temperature is a temperature selected from a temperature range, within which the desired frequencies (e.g., the ideal frequencies) of the crystal oscillator are higher in comparison with the desired frequencies (e.g., the ideal frequencies) at temperatures outside the temperature range. For example, at the peak temperature, the desired frequency (e.g., the ideal frequency) of the crystal oscillator is higher in comparison with the desired frequencies (e.g., the ideal frequencies) at temperatures outside the temperature range. In another example, at the peak temperature, the actual frequency (e.g., the measured frequency) of the crystal oscillator is higher in comparison with the actual frequencies (e.g., the measured frequencies) at temperatures outside the temperature range.

In yet another embodiment, the crystal oscillator is in the batch of crystal oscillators from which the one or more sample crystal oscillators have been selected at the process 210. For example, the crystal oscillator is not one oscillator of the one or more sample crystal oscillators. In yet another embodiment, the crystal oscillator included in a real-time-clock system is kept at the peak temperature for a period of time (e.g., 30 minutes) to ensure that the thermal equilibrium is reached. For example, afterwards, the real-time-clock system is set to output a signal with a desired frequency of 1 Hz, and then the actual frequency of the real-time-clock system is measured at the peak temperature, so that the actual frequency of the crystal oscillator at the peak temperature is determined.

At the process 222, a specific frequency compensation for the crystal oscillator at the peak temperature is determined. For example, the specific frequency compensation at the peak temperature is calculated as follows:

$$\Delta f_{s\_peak} = f_{d\_peak} - f_{a\_peak} \quad \text{(Equation 3)}$$

where $\Delta f_{s\_peak}$ represents the specific frequency compensation for the crystal oscillator at the peak temperature. Additionally, $f_{d\_peak}$ represents the desired frequency (e.g., the ideal frequency) of the crystal oscillator at the peak temperature, and $f_{a\_peak}$ represents the actual frequency of the crystal oscillator at the peak temperature.

At the process 224, specific frequency compensation as a function of temperature for the crystal oscillator is determined using the specific frequency compensation for the crystal oscillator at the peak temperature according to one embodiment. In one embodiment, based on Equation 2, the general frequency compensation at the peak temperature is calculated as follows:

$$\Delta f_{g\_peak} = a_N T_{peak}^N + a_{N-1} T_{peak}^{N-1} + \ldots + a_n T_{peak}^n + \ldots + a_1 T_{peak} + a_0 \quad \text{(Equation 4)}$$

where $\Delta f_{g\_peak}$ represents the general frequency compensation at the peak temperature. Additionally, $T_{peak}$ represents the peak temperature of the crystal oscillator. Moreover, n is smaller than or equal to N, and larger than or equal to zero, where N is an integer larger than 1. Also, $a_n$ represents N+1 general coefficients, with n ranging from 0 to N.

In another embodiment, based on Equations 3 and 4, a frequency offset between the general compensation and the specific compensation for the crystal oscillator at the peak temperature is determined as follows:

$$O_{s\_peak} = \Delta f_{g\_peak} - \Delta f_{s\_peak} \quad \text{(Equation 5)}$$

where $O_{s\_peak}$ represents the frequency offset between the general compensation and the specific compensation for the crystal oscillator at the peak temperature. Additionally, $\Delta f_{g\_peak}$ represents the general frequency compensation at the peak temperature as calculated according to Equation 4, and $\Delta f_{s\_peak}$ represents the specific frequency compensation for the crystal oscillator at the peak temperature as calculated according to Equation 3.

In yet another embodiment, based on Equations 2 and 5, specific frequency compensation as a function of temperature for the crystal oscillator is determined as follows:

$$\Delta f_s = \Delta f_g - O_{s\_peak} \quad \text{(Equation 6)}$$

where $\Delta f_s$ represents the specific frequency compensation as a function of temperature for the crystal oscillator. Additionally, $\Delta f_g$ represents the general frequency compensation as a function of temperature as calculated according to Equation 2. Moreover, $O_{s\_peak}$ represents the frequency offset between the general compensation and the specific compensation for the crystal oscillator at the peak temperature as calculated according to Equation 5.

In yet another embodiment, the specific frequency compensation as a function of temperature for the crystal oscillator is equal to the desired frequency (e.g., the ideal frequency) of the crystal oscillator minus the actual frequency of the crystal oscillator. For example, using Equation 2, Equation 5 becomes:

$$\Delta f_s = a_N T^N + a_{N-1} T^{N-1} + \ldots a_n T^n + \ldots + a_1 T + (a_0 - O_{s\_peak}) \quad \text{(Equation 7)}$$

where $\Delta f_s$ represents the specific frequency compensation as a function of temperature for the crystal oscillator, which is equal to the desired frequency (e.g., the ideal frequency) of the crystal oscillator minus the actual frequency of the crystal oscillator. Additionally, T represents the temperature of the crystal oscillator. Moreover, n is smaller than or equal to N, and larger than or equal to zero, where N is an integer larger than 1. Also, $a_n$ represents N+1 general coefficients, with n ranging from 0 to N, as shown in Equation 2. Additionally, $O_{s\_peak}$ represents the frequency offset between the general compensation and the specific compensation for the crystal oscillator at the peak temperature as calculated according to Equation 5.

In another example, the frequency offset (e.g., $O_{s\_peak}$) between the general compensation and the specific compensation for the crystal oscillator at the peak temperature is not equal to zero. In yet another example, the specific frequency compensation (e.g., $\Delta f_s$) as a function of temperature for the crystal oscillator is different from the general frequency compensation (e.g., $\Delta f_g$) as a function of temperature for crystal oscillator. In yet another example, the specific frequency compensation (e.g., $\Delta f_s$) as a function of temperature for the crystal oscillator is configured to provide multiple compensation values for the specific frequency compensation of the crystal oscillator in response to multiple temperature values (e.g., T) of the crystal oscillator respectively.

Figure 2C:
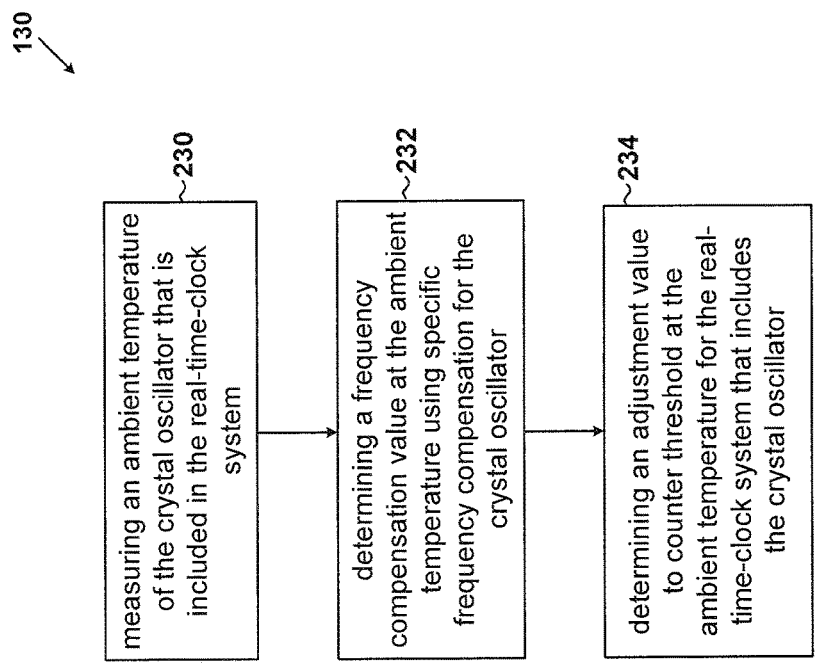
FIG. 2(C) is a simplified diagram showing the process 130 for performing frequency calibration at a specific temperature for the real-time-clock system that includes the crystal oscillator as part of the method 100 for temperature-dependent frequency compensation according to an embodiment of the present invention.

FIG. 2(C) is a simplified diagram showing the process 130 for performing frequency calibration at a specific temperature for the real-time-clock system that includes the crystal oscillator as part of the method 100 for temperature-dependent frequency compensation according to an embodiment of the present invention. This diagram is merely an example, which should not unduly limit the scope of the claims. One of ordinary skill in the art would recognize many variations, alternatives, and modifications. The process 130 for performing frequency calibration at a specific temperature for the real-time-clock system that includes the crystal oscillator includes a process 230 for measuring an ambient temperature of the crystal oscillator that is included in the real-time-clock system, a process 232 for determining a frequency compensation value at the ambient temperature using specific frequency compensation for the crystal oscillator, and a process 234 for determining an adjustment value to counter threshold at the ambient temperature for the real-time-clock system that includes the crystal oscillator.

At the process 230, an ambient temperature of the crystal oscillator that is included in the real-time-clock system is measured according to one embodiment. For example, the measurement is performed by a temperature sensor. In another example, the real-time clock system including the crystal oscillator is placed at the ambient temperature for a sufficiently long period of time, and the ambient temperature is the same as the temperature of the crystal oscillator. In yet another example, for the crystal oscillator, its specific frequency compensation as a function of temperature has been determined at the process 224.

At the process 232, a frequency compensation value at the ambient temperature using specific frequency compensation for the crystal oscillator is determined according to one embodiment. For example, based on Equation 7, the frequency compensation value at the ambient temperature is calculated as follows:

$$\Delta f_{s\_ambient} = a_N T_{ambient}^N + a_{N-1} T_{ambient}^{N-1} + \ldots + a_n T_{ambient}^n + \ldots + a_1 T_{ambient} + (a_0 - O_{s\_peak}) \quad \text{(Equation 8)}$$

where $\Delta f_{s\_ambient}$ represents the frequency compensation value at the ambient temperature for the crystal oscillator.

Additionally, $T_{ambient}$ represents the ambient temperature. Moreover, n is smaller than or equal to N, and larger than or equal to zero, where N is an integer larger than 1. Also, $a_n$ represents N+1 general coefficients, with n ranging from 0 to N. Additionally, $O_{s\_peak}$ represents the frequency offset between the general compensation and the specific compensation for the crystal oscillator at the peak temperature as calculated according to Equation 5.

At the process 234, an adjustment value to counter threshold at the ambient temperature for the real-time-clock system that includes the crystal oscillator is determined according to one embodiment. In one embodiment, the real-time-clock system also includes a clock-counter adjustment circuit. In another embodiment, the adjustment value to counter threshold is determined based on the frequency compensation value at the ambient temperature for the crystal oscillator as calculated according to Equation 8. For example, if the frequency compensation value at the ambient temperature for the crystal oscillator is larger than zero, the adjustment value to counter threshold is also larger than zero. In another example, if the frequency compensation value at the ambient temperature for the crystal oscillator is smaller than zero, the adjustment value to counter threshold is also smaller than zero.

In yet another embodiment, the clock-counter adjustment circuit adjusts the counter threshold for the real-time-clock system. For example, the clock-counter adjustment circuit changes the counter threshold of an internal signal generator for generating a signal with a desired frequency of 1 Hz (e.g., a one-second signal) by the real-time-clock system. In another example, if the adjustment value is a positive value, the clock-counter adjustment circuit increases the counter threshold, and if the adjustment value is a negative value, the clock-counter adjustment circuit decreases the counter threshold.

According to some embodiments, at the ambient temperature, if the real-time-clock system is set to output a signal with a desired frequency of 1 Hz (e.g., a one-second signal) and the crystal oscillator has an actual frequency equal to a desired frequency of 32.768 KHz, then the output signal of the real-time-clock system is generated by setting the counter threshold to 32768 and setting the signal period to be equal to a time duration during which an internal counter counts from 1 to the counter threshold at the crystal oscillator frequency. According to certain embodiments, if the real-time-clock system is set to output a signal with a desired frequency of 1 Hz (e.g., a one-second signal) and the crystal oscillator has an actual frequency that is not equal to a desired frequency of 32.768 KHz (e.g., as shown in Equation 8), then the output signal of the real-time-clock system is generated by adjusting the counter threshold with the adjustment value and setting the signal period to be equal to a time duration during which an internal counter counts from 1 to the adjusted counter threshold at the crystal oscillator frequency, where the adjusted counter threshold is equal to 32768 plus the adjustment value. For example, the adjustment value is determined by the frequency compensation value at the ambient temperature for the crystal oscillator as calculated according to Equation 8.

In one embodiment, at the ambient temperature, tens or hundreds of seconds are chosen as a compensation period to improve accuracy and precision of frequency compensation. For example, the crystal oscillator has a desired frequency of 32.768 KHz, but at the ambient temperature of 5° C., the frequency compensation value for the crystal oscillator is +0.0025 KHz. In another example, with the frequency compensation value of +0.0025 KHz for the crystal oscillator, if the compensation period is set to be 60 seconds, the adjustment value to the counter threshold is 150 for the entire compensation period.

According to some embodiments, with adjusted counter threshold, the signal with a desired frequency of 1 Hz (e.g., a one-second signal) that is generated by the real-time-clock system has an actual frequency that is close to 1 Hz or equal to 1 Hz. For example, the frequency error of the real-time clock system 360 is corrected (e.g., compensated at the ambient temperature). In another example, the correction of the frequency error reduces the magnitude of the frequency error. In yet another example, the correction of the frequency error eliminates the frequency error so that the actual frequency becomes equal to 1 Hz.

Figure 3:
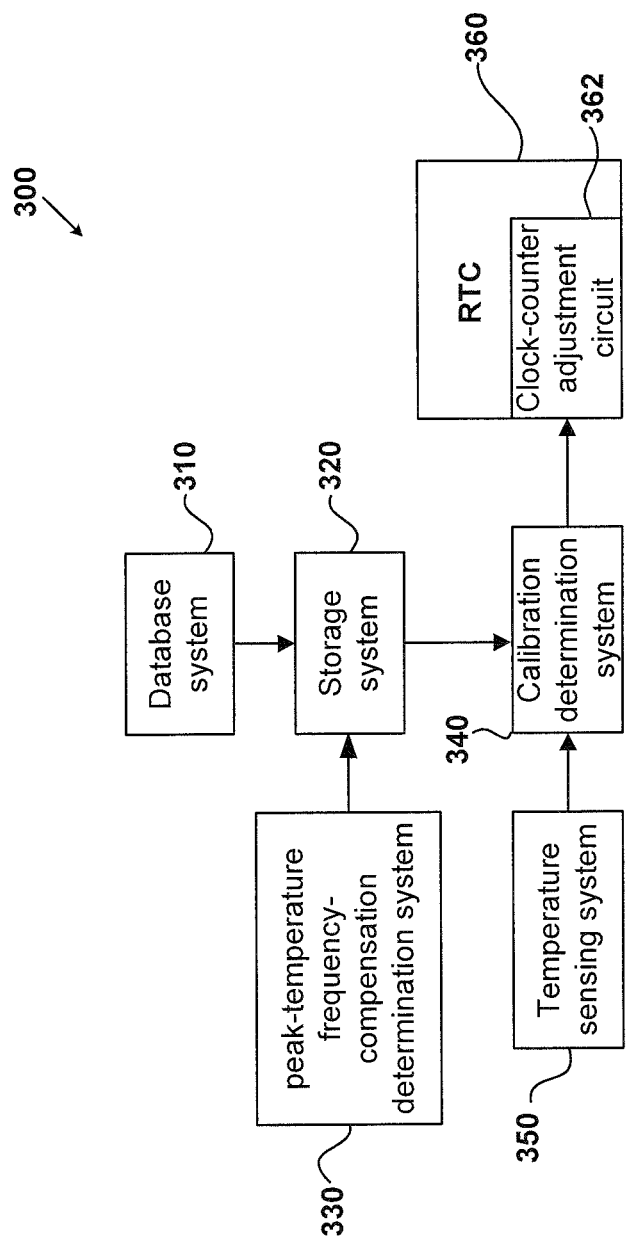
FIG. 3 is a simplified diagram showing a temperature-dependent frequency compensation system for one or more real-time clocks according to an embodiment of the present invention.

FIG. 3 is a simplified diagram showing a temperature-dependent frequency compensation system for one or more real-time clocks according to an embodiment of the present invention. This diagram is merely an example, which should not unduly limit the scope of the claims. One of ordinary skill in the art would recognize many variations, alternatives, and modifications. The temperature-dependent frequency compensation system 300 includes a database system 310, a storage system 320, a peak-temperature frequency-compensation determination system 330, a calibration determination system 340, and a temperature sensing system 350.

According to certain embodiments, the temperature-dependent frequency compensation system 300 is used to perform the method 100 for temperature-dependent frequency compensation. For example, the temperature-dependent frequency compensation system 300 is used to perform temperature-dependent frequency compensation to a real-time-clock system 360. In another example, the real-time-clock (RTC) system 360 includes a clock-counter adjustment circuit 362 and a crystal oscillator.

In one embodiment, the database system 310 is used to perform at least the process 214. For example, the database system 310 is configured to determine (e.g., calculate) general coefficients for general frequency compensation as a function of temperature for a batch of crystal oscillators from which one or more sample crystal oscillators are selected. In another example, the one or more sample crystal oscillators include a plurality of sample crystal oscillators.

In yet another example, the determined general coefficients (e.g., general coefficients $a_n$, with n ranging from 0 to N, as shown in Equation 2) are sent to the storage system 320 (e.g., through an interface circuit) and stored by the storage system 320 in order to be used by the calibration determination system 340. In yet another example, the storage system 320 includes erasable non-volatile storage media (e.g., one or more flash drives and/or electrically-erasable storage media).

In another embodiment, the peak-temperature frequency-compensation determination system 330 is used to perform at least the process 222. For example, the peak-temperature frequency-compensation determination system 330 is configured to determine a specific frequency compensation at the peak temperature for a crystal oscillator in the batch of crystal oscillators. In another example, the peak-temperature frequency-compensation determination system 330 is used to repeat the process 222 for different crystal oscillators in the batch of crystal oscillators. In yet another example, one or more specific frequency compensations determined at one or more corresponding peak temperatures for one or more corresponding crystal oscillators are sent (e.g., through an interface circuit) to the storage system 320, which is configured to store the one or more specific frequency compensations.

According to one embodiment, the temperature sensing system 350 is used to perform at least the process 230. For example, the temperature sensing system 350 is configured to measure one or more ambient temperatures of the one or more crystal oscillators. In another example, the temperature sensing system 350 is further configured to provide (e.g., through an interface circuit) one or more measurement data related to the one or more measured ambient temperatures to the calibration determination system 340. In one embodiment, the real-time-clock system 360 including a crystal oscillator is placed at an ambient temperature for a sufficiently long period of time, and the ambient temperature is the same as the temperature of the crystal oscillator. In another embodiment, if the ambient temperature is detected as one or more analog signals, the temperature sensing system 350 converts the one or more analog signals to one or more digital signals and sends the one or more digital signals to the calibration determination system 340.

According to another embodiment, the calibration determination system 340 is used to perform at least the processes 224, 232 and 234. In one embodiment, the calibration determination system 340 is configured to determine one or more specific frequency compensations as one or more corresponding functions of temperature for the one or more corresponding crystal oscillators. For example, the calibration determination system 340 performs the process 224 based at least in part on the one or more specific frequency compensations for the one or more corresponding crystal oscillators at the one or more corresponding peak temperatures provided by the storage system 320. In another example, the calibration determination system 340 performs the process 224 also based at least in part on the determined general coefficients provided by the storage system 320.

In another embodiment, the calibration determination system 340 is configured to determine (e.g., calculate) one or more frequency compensation values at one or more corresponding ambient temperatures using one or more corresponding specific frequency compensations for the one or more corresponding crystal oscillators. For example, the calibration determination system 340 performs the process 232 based at least in part on one or more measurement data related to the one or more measured ambient temperatures provided by the temperature sensing system 350.

In yet another embodiment, the calibration determination system 340 is further configured to determine one or more adjustment values to one or more corresponding counter thresholds for one or more corresponding real-time-clock systems (e.g., the real-time-clock system 360) that include one or more corresponding crystal oscillators at one or more corresponding ambient temperatures. For example, the calibration determination system 340 is used to perform the process 234 based at least in part on a compensation period (e.g., 1 second, tens of seconds, or hundreds of seconds) as provided by the storage system 320. In another example, the one or more adjustment values to the one or more corresponding counter thresholds for the one or more corresponding real-time-clock systems are provided by the calibration determination system 340 (e.g., through an interface circuit) to the one or more corresponding clock-counter adjustment circuits (e.g., the clock-counter adjustment circuit 362). In yet another example, the one or more clock-counter adjustment circuits (e.g., the clock-counter adjustment circuit 362) adjust one or more corresponding counter thresholds for one or more corresponding real-time-clock systems (e.g., the real-time clock system 360) that include the one or more corresponding clock-counter adjustment circuits (e.g., the clock-counter adjustment circuit 362).

In yet another embodiment, the calibration determination system 340 is further configured to determine an adjustment value to counter threshold for the real-time-clock system 360 that include the crystal oscillator at the ambient temperature. For example, the calibration determination system 340 performs the process 234 based at least in part on a compensation period (e.g., 1 second, tens of seconds, or hundreds of seconds) provided by the storage system 320. In another example, the adjustment value to counter threshold for the real-time-clock system 360 is provided by the calibration determination system 340 (e.g., through an interface circuit) to the clock-counter adjustment circuit 362.

In yet another embodiment, the clock-counter adjustment circuit 362 adjusts the counter threshold for the real-time-clock system 360. For example, the clock-counter adjustment circuit 362 changes the counter threshold of an internal signal generator for generating a signal with a desired frequency of 1 Hz (e.g., a one-second signal) by the real-time-clock system 360. In another example, if the adjustment value is a positive value, the clock-counter adjustment circuit 362 increases the counter threshold, and if the adjustment value is a negative value, the clock-counter adjustment circuit 360 decreases the counter threshold.

According to some embodiments, with adjusted counter threshold, the signal with a desired frequency of 1 Hz (e.g., a one-second signal) that is generated by the real-time-clock system 360 has an actual frequency that is close to 1 Hz or equal to 1 Hz. For example, the frequency error of the real-time-clock system 360 is corrected (e.g., compensated at the ambient temperature through adjustment value to counter threshold). In another example, the correction of the frequency error reduces the magnitude of the frequency error. In yet another example, the correction of the frequency error eliminates the frequency error so that the actual frequency becomes equal to 1 Hz.

Figure 4:
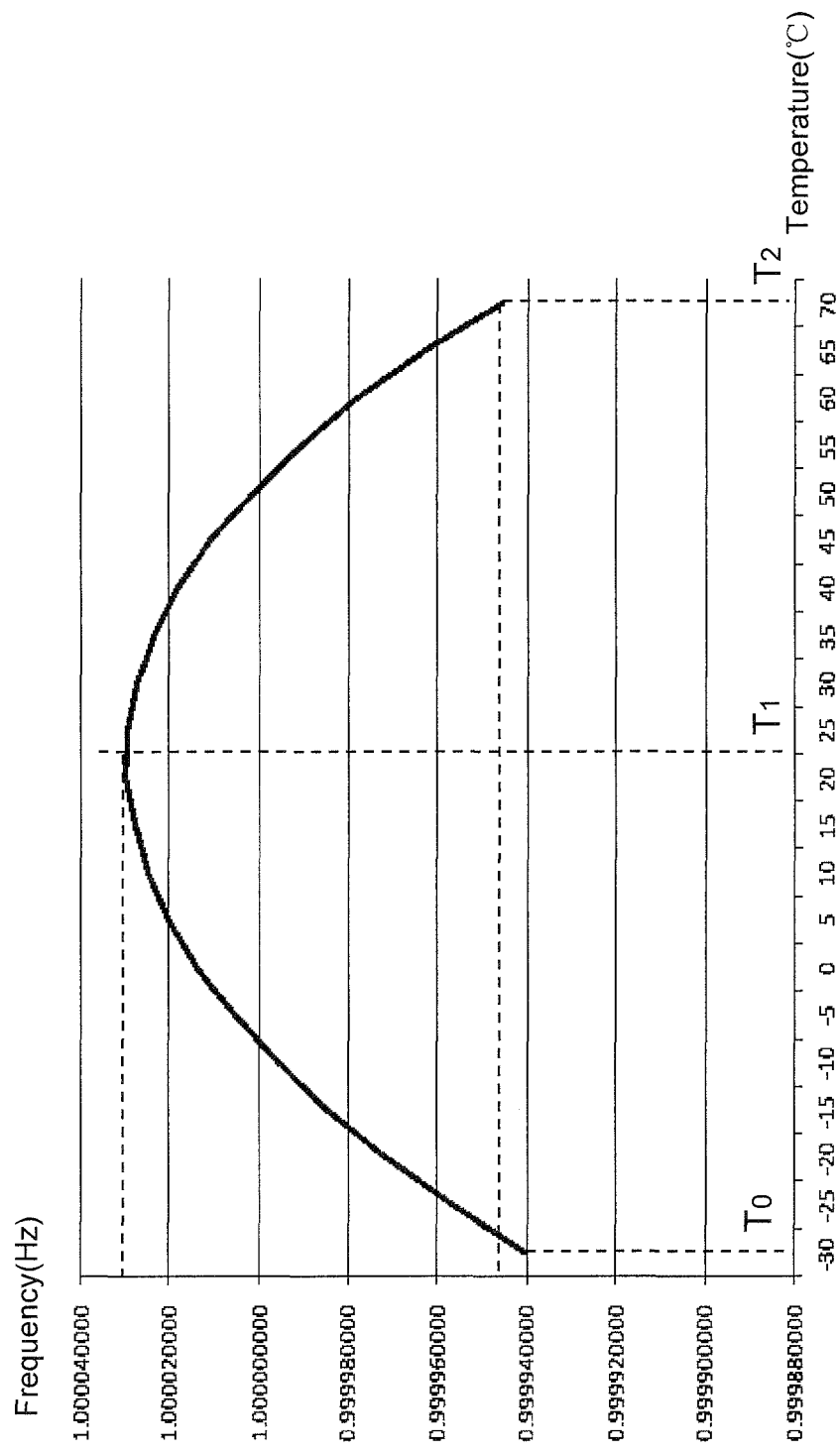
FIG. 4 is a simplified diagram showing an actual frequency of a one-second signal of a real-time-clock system that includes a crystal oscillator as a function of temperature without adjustment to counter threshold according to one embodiment.

FIG. 4 is a simplified diagram showing an actual frequency of a one-second signal of a real-time-clock system that includes a crystal oscillator as a function of temperature without adjustment to counter threshold according to one embodiment. As an example, the desired frequency (e.g., the ideal frequency) of the one-second signal is 1 Hz and the desired period (e.g., the ideal period) of the one-second signal is 1 second, but the actual frequency of the one-second signal is not a constant equal to 1 Hz and the actual period of the one-second signal is not a constant equal to 1 second. In another example, the actual frequency of the one-second signal changes with temperature, and the actual period of the one-second signal changes with temperature.

As shown in FIG. 4, in a range between temperature $T_0$ (e.g., about −27° C.) and temperature $T_1$ (e.g., about 25° C.), the actual frequency of the one-second signal increases with increasing temperature (e.g., from about 0.99994 Hz at $T_0$ to about 1.00003 Hz at $T_1$). Also, as shown in FIG. 4, in a range between the temperature $T_1$ (e.g., about 25° C.) and temperature $T_2$ (e.g., about 73° C.), the actual frequency of the one-second signal decreases with increasing temperature (e.g., from about 1.00003 Hz at $T_1$ to about 0.999945 Hz at $T_2$).

Figure 5:
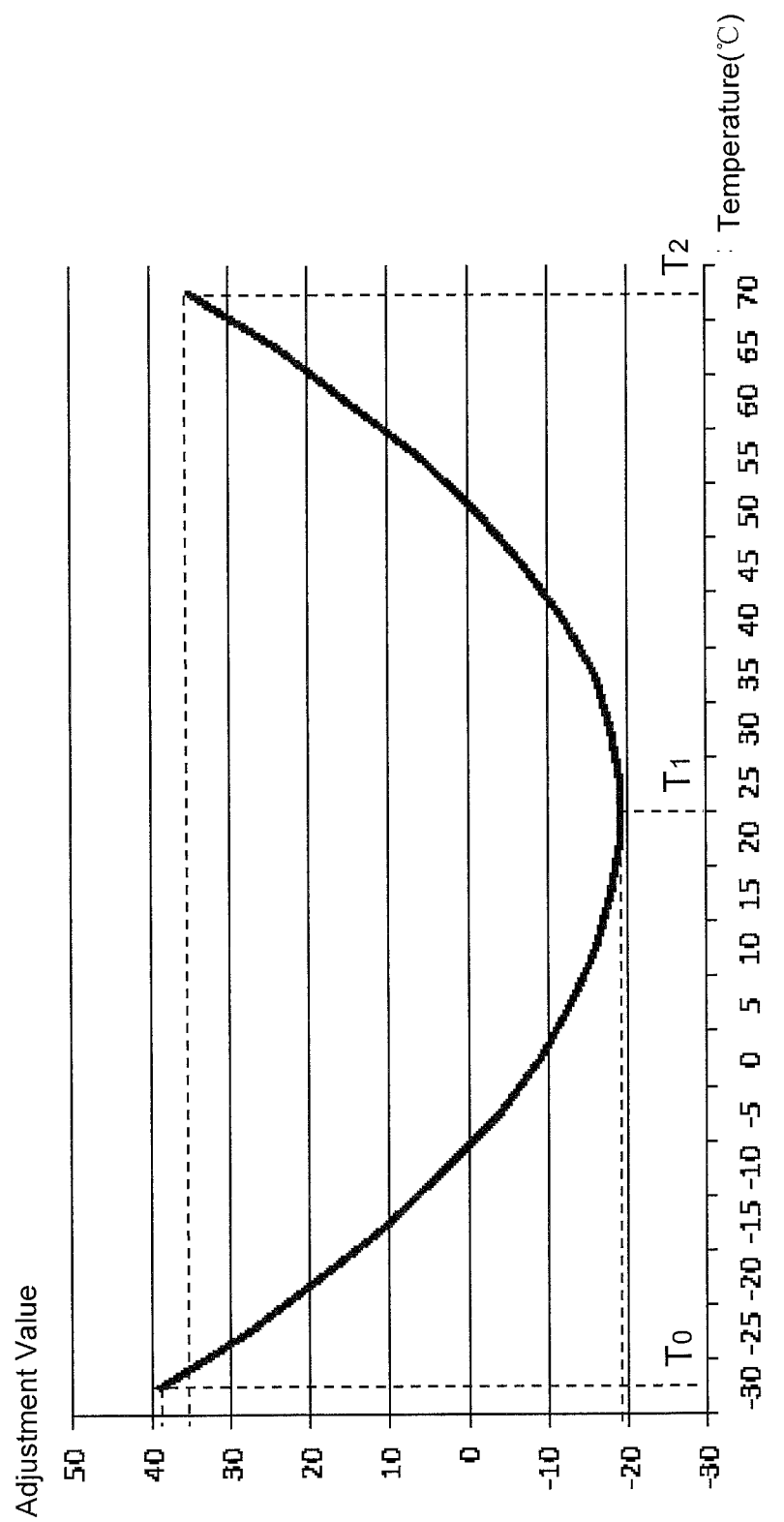
FIG. 5 is a simplified diagram showing an adjustment value to counter threshold as a function of temperature using the method for temperature-dependent frequency compensation as shown in FIG. 1 according to an embodiment of the present invention.

FIG. 5 is a simplified diagram showing an adjustment value to counter threshold as a function of temperature using the method for temperature-dependent frequency compensation as shown in FIG. 1 according to an embodiment of the present invention. This diagram is merely an example, which should not unduly limit the scope of the claims. One of ordinary skill in the art would recognize many variations, alternatives, and modifications. As an example, the data associated with the relationship between the adjustment value and the temperature are obtained by performing at least the process 130 at multiple ambient temperatures. In another example, the adjustment value changes with temperature.

As shown in FIG. 5, in a range between the temperature $T_0$ (e.g., about −27° C.) and the temperature $T_1$ (e.g., about 25° C.), the adjustment value to counter threshold decreases with increasing temperature (e.g., from about 39 at $T_0$ to about −19 at $T_1$) according to one embodiment. Also as shown in FIG. 5, in a range between the temperature $T_1$ (e.g., about 25° C.) and the temperature $T_2$ (e.g., about 73° C.), the adjustment value to counter threshold increases with increasing temperature (e.g., from about −19 at $T_1$ to about 37 at $T_2$) according to another embodiment.

Figure 6:
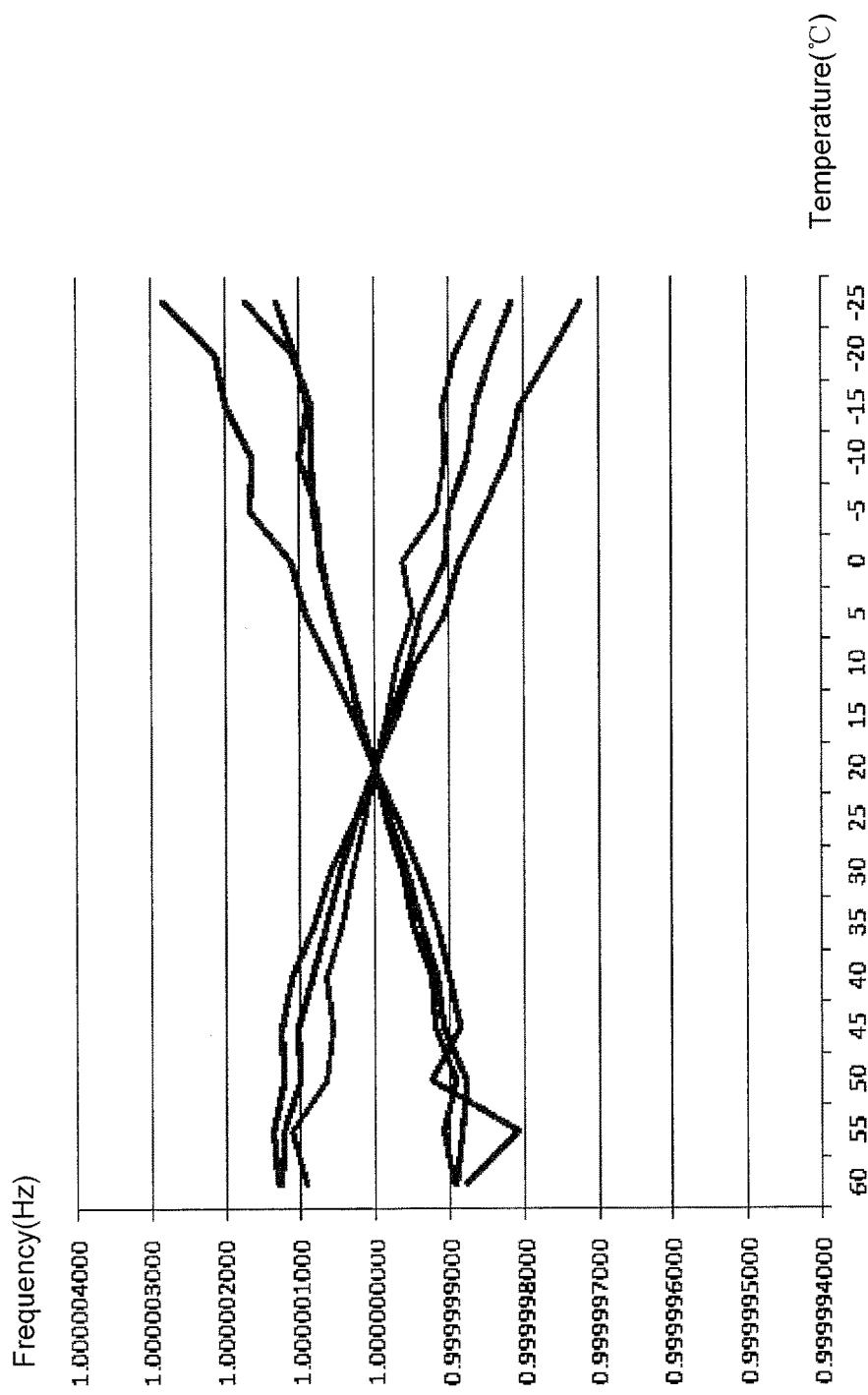
FIG. 6 is a simplified diagram showing an actual frequency of a one-second signal as a function of temperature with adjustment to counter threshold for each of six real-time-clock systems that each include a crystal oscillator using the method for temperature-dependent frequency compensation as shown in FIG. 1 according to certain embodiments of the present invention.

FIG. 6 is a simplified diagram showing an actual frequency of a one-second signal as a function of temperature with adjustment to counter threshold for each of six real-time-clock systems that each include a crystal oscillator using the method for temperature-dependent frequency compensation as shown in FIG. 1 according to certain embodiments of the present invention. This diagram is merely an example, which should not unduly limit the scope of the claims. One of ordinary skill in the art would recognize many variations, alternatives, and modifications.

As an example, the data associated with the relationship between the actual frequency and the temperature for each of the six real-time-clock systems are obtained by using the adjustment values obtained from the process 130 to adjust counter threshold through the clock-counter adjustment circuit (e.g., the clock-counter adjustment circuit 362) for each of the six real-time-clock systems (e.g., the real-time-clock system 360). In another example, as shown in FIG. 6, with adjustment to counter threshold, the difference between the actual frequency and the desired frequency has an absolute value that is about 10 times smaller than the absolute value of the difference between the actual frequency and the desired frequency without adjustment to counter threshold as shown in FIG. 4.

According to another embodiment, a method for temperature-dependent frequency compensation includes determining a first frequency compensation as a first function of temperature using one or more crystal oscillators, processing information associated with the first frequency compensation as the first function of temperature, and determining a second frequency compensation for a crystal oscillator as a second function of temperature based on at least information associated with the first frequency compensation as the first function of temperature. The one or more crystal oscillators do not include the crystal oscillator, and the first frequency compensation as the first function of temperature is different from the second frequency compensation as the second function of temperature. For example, the method is implemented according to at least FIG. 1 and/or FIG. 3.

According to yet another embodiment, a method for temperature-dependent frequency compensation includes determining a first frequency compensation as a first function of temperature using one or more crystal oscillators, processing information associated with the first frequency compensation as the first function of temperature, and determining a second frequency compensation for a crystal oscillator as a second function of temperature based on at least information associated with the first frequency compensation as the first function of temperature. The first function of temperature is configured to provide multiple first compensation values for the first frequency compensation in response to multiple first temperatures respectively, and the second function of temperature is configured to provide multiple second compensation values for the second frequency compensation in response to multiple second temperatures respectively. For example, the method is implemented according to at least FIG. 1 and/or FIG. 3.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to perform the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, EEPROM, Flash memory, flat files, databases, programming data structures, programming variables, IF-THEN (or similar type) statement constructs, application programming interface, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, DVD, etc.) that contain instructions (e.g., software) for use in execution by a processor to perform the methods' operations and implement the systems described herein. The computer components, software modules, functions, data stores and data structures described herein may be connected directly or indirectly to each other in order to allow the flow of data needed for their operations. It is also noted that a module or processor includes a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include client devices and servers. A client device and server are generally remote from each other and typically interact through a communication network. The relationship of client device and server arises by virtue of computer programs running on the respective computers and having a client device-server relationship to each other.

This specification contains many specifics for particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be removed from the combination, and a combination may, for example, be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Although specific embodiments of the present invention have been described, it is understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for temperature-dependent frequency compensation, the method comprising:
    determining a first frequency compensation as a first function of temperature using one or more crystal oscillators;
    processing information associated with the first frequency compensation as the first function of temperature; and
    determining a second frequency compensation for a crystal oscillator as a second function of temperature based on at least information associated with the first frequency compensation as the first function of temperature;
    wherein:
        the one or more crystal oscillators do not include the crystal oscillator; and
        the first frequency compensation as the first function of temperature is different from the second frequency compensation as the second function of temperature;
    wherein the determining a second frequency compensation for a crystal oscillator as a second function of temperature based on at least information associated with the first frequency compensation as the first function of temperature includes:
        measuring an actual frequency of the crystal oscillator at a selected temperature;
        determining a third frequency compensation for the crystal oscillator at the selected temperature based at least in part on the measured actual frequency;
        processing information associated with the third frequency compensation for the crystal oscillator at the selected temperature; and
        determining the second frequency compensation for the crystal oscillator as the second function of temperature based on at least information associated with the first frequency compensation as the first function of temperature and the third frequency compensation for the crystal oscillator at the selected temperature;
    wherein the determining a third frequency compensation for the crystal oscillator at the selected temperature based at least in part on the measured actual frequency includes determining the third frequency compensation equal to a desired frequency of the crystal oscillator at the selected temperature minus the actual frequency of the crystal oscillator at the selected temperature.

2. The method of claim 1, wherein:
    the selected temperature is a peak temperature for the crystal oscillator; and
    the desired frequency of the crystal oscillator at the selected temperature is the desired frequency of the crystal oscillator at the peak temperature.

3. The method of claim 1 wherein the determining a first frequency compensation as a first function of temperature using one or more crystal oscillators includes determining a plurality of coefficients for the first frequency compensation as the first function of temperature.

4. The method of claim 3 wherein the plurality of coefficients is related to the first function of temperature.

5. The method of claim 3 wherein the determining a first frequency compensation as a first function of temperature using one or more crystal oscillators includes:
    selecting the one or more crystal oscillators from a batch of crystal oscillators; and
    measuring a plurality of actual frequencies of the one or more crystal oscillators at a plurality of temperatures;
    wherein the determining a plurality of coefficients for the first frequency compensation as the first function of temperature includes determining the plurality of coefficients based on at least information associated with the plurality of measured actual frequencies of the one or more crystal oscillators at the plurality of temperatures.

6. The method of claim 5 wherein the measuring a plurality of actual frequencies of the one or more crystal oscillators at a plurality of temperatures includes, for each crystal oscillator of the one or more crystal oscillators, measuring multiple actual frequencies at the plurality of temperatures.

7. The method of claim 3 wherein the determining a first frequency compensation as a first function of temperature using one or more crystal oscillators further includes storing the plurality of coefficients.

8. The method of claim 1, and further comprising performing a frequency calibration at a specific temperature for a real-time-clock system, the real-time-clock system including the crystal oscillator.

9. The method of claim 8 wherein the performing a frequency calibration at a specific temperature for a real-time-clock system includes:
    measuring an ambient temperature of the crystal oscillator that is included in the real-time-clock system;
    determining a frequency compensation value at the ambient temperature using the second frequency compensation for the crystal oscillator as the second function of temperature; and determining an adjustment value to a counter threshold at the ambient temperature for the real-time-clock system.

10. The method of claim 1 wherein the one or more crystal oscillators include a plurality of crystal oscillators.

11. A method for temperature-dependent frequency compensation, the method comprising:
   determining a first frequency compensation as a first function of temperature using one or more crystal oscillators;
   processing information associated with the first frequency compensation as the first function of temperature; and
   determining a second frequency compensation for a crystal oscillator as a second function of temperature based on at least information associated with the first frequency compensation as the first function of temperature;
   wherein:
      the one or more crystal oscillators do not include the crystal oscillator; and
      the first frequency compensation as the first function of temperature is different from the second frequency compensation as the second function of temperature;
   wherein the determining a second frequency compensation for a crystal oscillator as a second function of temperature based on at least information associated with the first frequency compensation as the first function of temperature includes:
      measuring an actual frequency of the crystal oscillator at a selected temperature;
      determining a third frequency compensation for the crystal oscillator at the selected temperature based at least in part on the measured actual frequency;
      processing information associated with the third frequency compensation for the crystal oscillator at the selected temperature; and
      determining the second frequency compensation for the crystal oscillator as the second function of temperature based on at least information associated with the first frequency compensation as the first function of temperature and the third frequency compensation for the crystal oscillator at the selected temperature;
   wherein the determining the second frequency compensation for the crystal oscillator as the second function of temperature based on at least information associated with the first frequency compensation as the first function of temperature and the third frequency compensation for the crystal oscillator at the selected temperature includes:
      determining a frequency compensation value at the selected temperature based at least in part on the first frequency compensation as the first function of temperature;
      calculating a frequency offset equal to the frequency compensation value minus the third frequency compensation for the crystal oscillator at the selected temperature; and
      determining the second frequency compensation for the crystal oscillator as the second function of temperature equal to the first frequency compensation as the first function of temperature minus the frequency offset.

12. A method for temperature-dependent frequency compensation, the method comprising:
   determining a first frequency compensation as a first function of temperature using one or more crystal oscillators;
   processing information associated with the first frequency compensation as the first function of temperature; and
   determining a second frequency compensation for a crystal oscillator as a second function of temperature based on at least information associated with the first frequency compensation as the first function of temperature;
   wherein:
      the first function of temperature is configured to provide multiple first compensation values for the first frequency compensation in response to multiple first temperatures respectively; and
      the second function of temperature is configured to provide multiple second compensation values for the second frequency compensation in response to multiple second temperatures respectively;
   wherein the determining a second frequency compensation for a crystal oscillator as a second function of temperature based on at least information associated with the first frequency compensation as the first function of temperature includes:
      measuring an actual frequency of the crystal oscillator at a selected temperature;
      determining a third frequency compensation for the crystal oscillator at the selected temperature based at least in part on the measured actual frequency;
      processing information associated with the third frequency compensation for the crystal oscillator at the selected temperature; and
      determining the second frequency compensation for the crystal oscillator as the second function of temperature based on at least information associated with the first frequency compensation as the first function of temperature and the third frequency compensation for the crystal oscillator at the selected temperature;
   wherein the determining a third frequency compensation for the crystal oscillator at the selected temperature based at least in part on the measured actual frequency includes determining the third frequency compensation equal to a desired frequency of the crystal oscillator at the selected temperature minus the actual frequency of the crystal oscillator at the selected temperature.

13. The method of claim 12 wherein:
   the one or more crystal oscillators do not include the crystal oscillator; and
   the first frequency compensation as the first function of temperature is different from the second frequency compensation as the second function of temperature.

14. The method of claim 12 wherein the determining a first frequency compensation as a first function of temperature using one or more crystal oscillators includes determining a plurality of coefficients for the first frequency compensation as the first function of temperature.

15. The method of claim 14 wherein the plurality of coefficients is related to the first function of temperature.

16. The method of claim 12, and further comprising performing a frequency calibration at a specific temperature for a real-time-clock system, the real-time-clock system including the crystal oscillator.

17. The method of claim 12 wherein the one or more crystal oscillators include a plurality of crystal oscillators.

* * * * *